(12) United States Patent
Murugan et al.

(10) Patent No.: US 12,261,250 B2
(45) Date of Patent: Mar. 25, 2025

(54) DISPLAY PANEL INCLUDING SUB-PIXELS FOR PROVIDING DUAL COLOR LIGHTS

(71) Applicant: PlayNitride Display Co., Ltd., MiaoLi County (TW)

(72) Inventors: Loganathan Murugan, MiaoLi County (TW); Sheng-Yuan Sun, MiaoLi County (TW); Po-Wei Chiu, MiaoLi County (TW)

(73) Assignee: PlayNitride Display Co., Ltd., Miaoli County (TW)

( * ) Notice: Subject to any disclaimer, the term of this patent is extended or adjusted under 35 U.S.C. 154(b) by 394 days.

(21) Appl. No.: 17/829,368

(22) Filed: Jun. 1, 2022

(65) Prior Publication Data

US 2023/0395759 A1   Dec. 7, 2023

(51) Int. Cl.
*H01L 33/50* (2010.01)
*H01L 27/15* (2006.01)

(52) U.S. Cl.
CPC .......... *H01L 33/505* (2013.01); *H01L 27/156* (2013.01)

(58) Field of Classification Search
CPC .. H01L 33/505; H01L 27/156; H01L 25/0753
See application file for complete search history.

(56) References Cited

U.S. PATENT DOCUMENTS

| | | | |
|---|---|---|---|
| 11,877,489 B2 * | 1/2024 | Hack | H10K 59/35 |
| 2022/0102442 A1 * | 3/2022 | Hack | H10K 50/115 |
| 2023/0140197 A1 * | 5/2023 | Chen | H01L 33/505 |
| | | | 257/79 |
| 2023/0335577 A1 * | 10/2023 | Park | H01L 27/156 |
| 2024/0038749 A1 * | 2/2024 | Wu | H01L 24/32 |
| 2024/0114741 A1 * | 4/2024 | Hack | H10K 59/351 |

* cited by examiner

Primary Examiner — J. E. Schoenholtz
(74) Attorney, Agent, or Firm — JCIPRNET

(57) ABSTRACT

A display panel includes a pixel unit. The pixel unit includes a first sub-pixel and a second sub-pixel. The first sub-pixel includes a first light-emitting element, a first light source element, and a first color conversion structure. A light emitted by the first light-emitting element has a first color. The first color conversion structure is disposed on the first light source element and adapted to convert a light emitted by the first light source element into a light of the first color. The second sub-pixel includes a second light-emitting element. A light emitted by the second light-emitting element has a second color different from the first color.

11 Claims, 7 Drawing Sheets

DISPLAY PANEL INCLUDING SUB-PIXELS FOR PROVIDING DUAL COLOR LIGHTS

BACKGROUND

Technical Field

The disclosure relates to an electronic device, and particularly relates to a display panel.

Description of Related Art

A self-luminous display panel is provided with light-emitting elements as display pixels. Common light-emitting elements include light-emitting diodes (LEDs), micro LEDs (μLEDs), mini LEDs, and organic LEDs (OLEDs). As the size of the light-emitting element is gradually reduced and the pixels per inch (PPI) is increased, the display panel can achieve display images with higher resolution. However, reduction in the size of the light-emitting element also brings some issues, such as decreased external quantum efficiency of the light-emitting element, which affects display quality of the display panel.

SUMMARY

The disclosure provides a display panel that has a desired display quality.

According to an embodiment of the disclosure, a display panel includes a pixel unit. The pixel unit includes a first sub-pixel and a second sub-pixel. The first sub-pixel includes a first light-emitting element, a first light source element, and a first color conversion structure. A light emitted by the first light-emitting element has a first color. The first color conversion structure is disposed on the first light source element and adapted to convert a light emitted by the first light source element into a light of the first color. The second sub-pixel includes a second light-emitting element. A light emitted by the second light-emitting element has a second color different from the first color.

Based on the foregoing, in the display panel according to the embodiments of the disclosure, the first sub-pixel in the pixel unit is composed of the first light-emitting element, the first light source element, and the first color conversion structure. The first light-emitting element emits a light of the first color. The first color conversion structure is disposed on the first light source element and converts the light emitted by the first light source element into a light of the first color. Accordingly, the light of the first color emitted by the first light source element and the first color conversion structure combined with the light of the first color emitted by the first light-emitting element helps to improve the adversely affected luminous efficiency of the light-emitting element.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
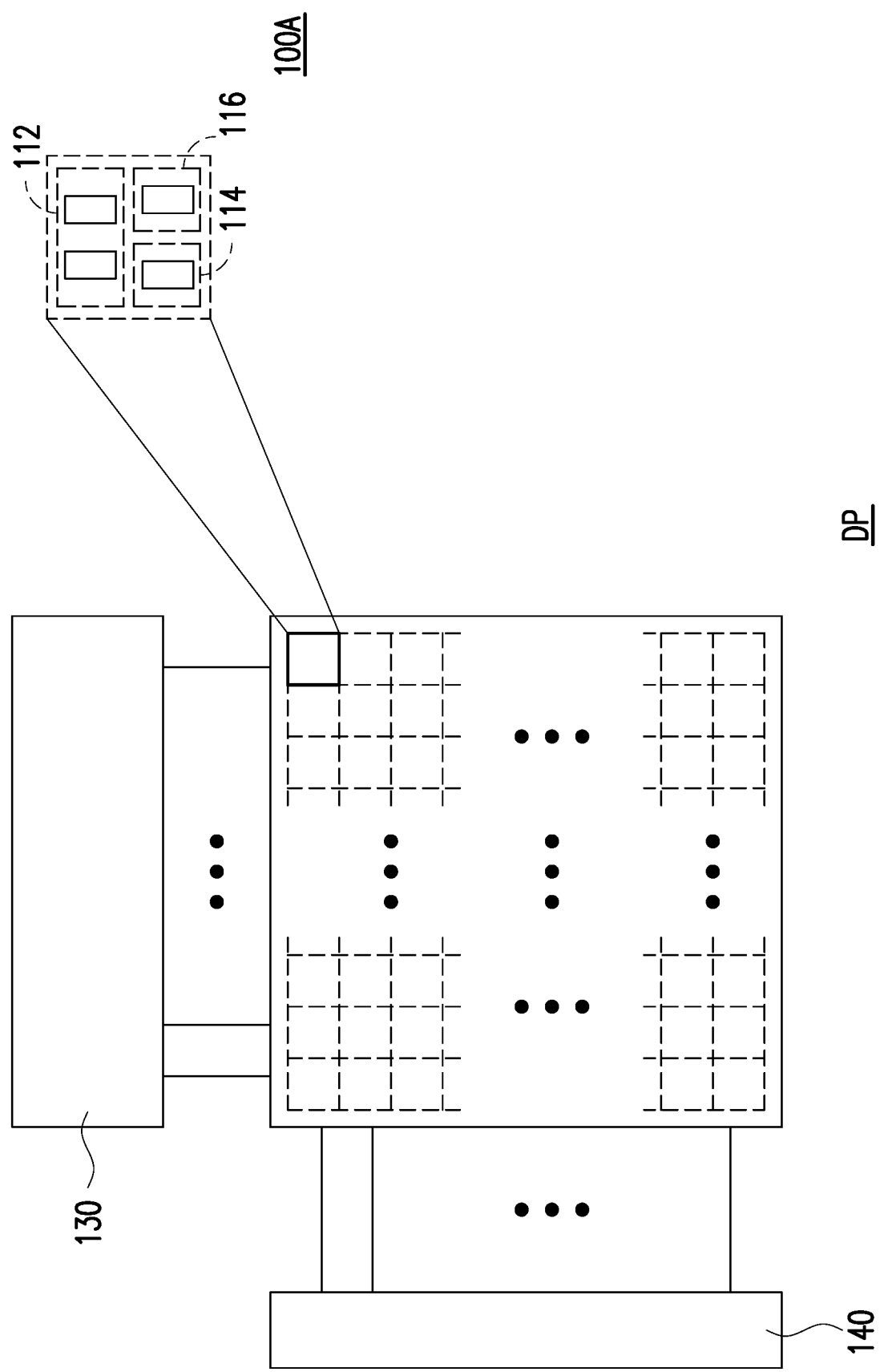
FIG. 1 is a schematic diagram of a display panel according to an embodiment of the disclosure.

FIG. 1 is a schematic diagram of a display panel according to an embodiment of the disclosure. A display panel DP includes a plurality of pixel units 100A, a scan driving circuit 140, and a data driving circuit 130. The pixel units 100A are arranged into an array. The scan driving circuit 140 is configured to provide a scan signal to the corresponding pixel unit 100A, and the data driving circuit 130 is configured to provide a data signal to the corresponding pixel unit 100A, so that each individual pixel unit 100A is independently driven. In addition, the pixel unit 100A includes a plurality of sub-pixels, for example, a first sub-pixel 112, a second sub-pixel 114, and a third sub-pixel 116. In this embodiment, each pixel unit 100A is described as including three sub-pixels as an example, but not limited thereto. In some embodiments, each pixel unit 100A may include two sub-pixels, four sub-pixels, or other numbers of sub-pixels.

Figure 2A:
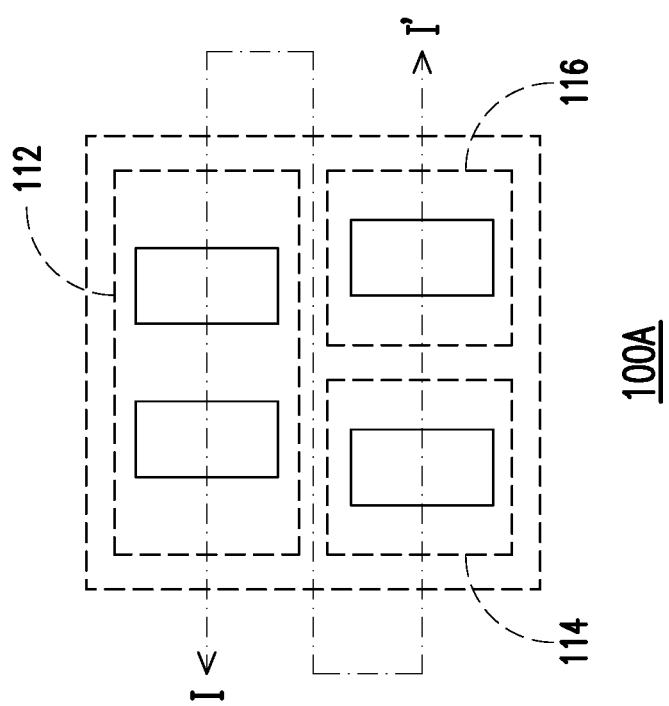
FIG. 2A is a schematic diagram of a pixel unit according to an embodiment of the disclosure.
Figure 2B:
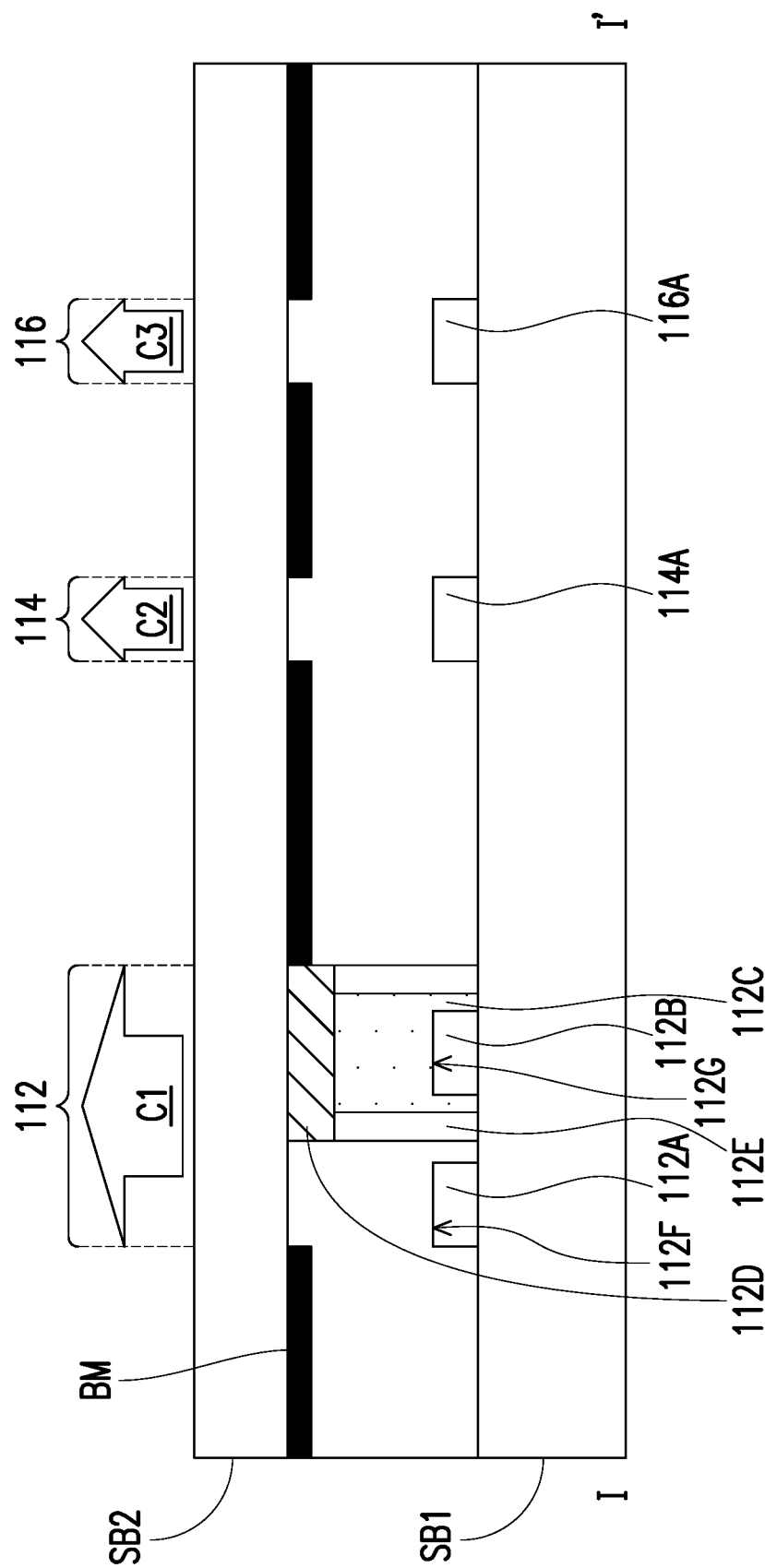
FIG. 2B is a schematic cross-sectional view of FIG. 2A along section line I-I'.

FIG. 2A is a schematic diagram of a pixel unit according to an embodiment of the disclosure. FIG. 2B is a schematic cross-sectional view of FIG. 2A along section line I-I'. With reference to FIG. 2A and FIG. 2B, the pixel unit 100A includes the first sub-pixel 112 and the second sub-pixel 114 adjacent to each other. The first sub-pixel 112 includes a first light-emitting element 112A, a first light source element 112B, and a first color conversion structure 112C. The first light-emitting element 112A and the first light source element 112B may be light-emitting diodes (LEDs), mini LEDs, micro LEDs (μLEDs), organic LEDs (OLEDs), any light-emitting elements, or the like. The first light-emitting element 112A and the first light source element 112B are configured to provide light of different wavelengths. For example, a light emitted by the first light-emitting element 112A and a light emitted by the first light source element 112B present different colors. The first color conversion structure 112C may be configured to convert the wavelength of the light emitted by the first light source element 112B, so that the first light source element 112B and the first color conversion structure 112C may be combined with each other to provide light of the same color as that of the first light-emitting element 112A. Accordingly, the first sub-pixel 112 presents the color by adopting two light-emitting means, where the light of the first light-emitting element 112A is directly emitted to present the color of the first sub-pixel 112, and the light of the first light source element 112B is not directly emitted but is converted by the first color conversion structure 112C and then emitted to present the color of the first sub-pixel 112. Therefore, although both the first light-emitting element 112A and the first light source element 112B may be implemented by elements such as light-emitting diodes, the first light-emitting element 112A and the first light source element 112B are named with different terms in the specification. In addition, the first sub-pixel 112 and the second sub-pixel 114 are disposed adjacent to each other in this embodiment, but in other embodiment, a layout arrangement in which other sub-pixels are disposed between the first sub-pixel 112 and the second sub-pixel 114 is not excluded.

In some embodiments, the first color conversion structure 112C may be a quantum dot color conversion structure or a polymer color conversion structure. The first color conversion structure 112C can absorb short-wavelength light while converting the same into long-wavelength light. For example, the first color conversion structure 112C can absorb short-wavelength ultraviolet light (with a wavelength approximately ranging from 1 nm to 380 nm), purple light (with a wavelength approximately ranging from 380 nm to 450 nm), or blue light (with a wavelength approximately ranging from 450 nm to 495 nm), while converting the same into long-wavelength red light (with a wavelength approximately ranging from 620 nm to 750 nm), yellow light (with a wavelength approximately ranging from 570 nm to 590 nm), green light (with a wavelength approximately ranging from 495 nm to 570 nm), or the like. The first color conversion structure 112C is disposed on the first light source element 112B and is configured to absorb and convert the light emitted by the first light source element 112B. Accordingly, the light emitted by the first light source element 112B is a short-wavelength light, such as blue light, ultraviolet light, or deep ultraviolet light, that can be absorbed by the first color conversion structure 112C. After the first color conversion structure 112C absorbs a short-wavelength light, the wavelength of the light that can be emitted by the first color conversion structure 112C may be determined depending on parameters such as the material and the microstructure of the first color conversion structure 112C. Therefore, based on the selection of materials, a light emitted by the first color conversion structure 112C may have a specific color different from the color of the absorbed light. In this embodiment, the light emitted by the first light-emitting element 112A has a first color C1, and the light emitted by the first light source element 112B does not have the first color C1. The first color conversion structure 112C is disposed on the first light source element 112B, and is adapted to convert the light emitted by the first light source element 112B into a light of the first color C1. Accordingly, the first sub-pixel 112 may adopt two light-emitting means to present the first color C1.

In this embodiment, the second sub-pixel 114 includes a second light-emitting element 114A. A light emitted by the second light-emitting element 114A has a second color C2 different from the first color C1. The wavelength of the light emitted by the second light-emitting element 114A is shorter than the wavelength of the light emitted by the first light-emitting element 112A. For example, the first color C1 may be red, and the second color C2 may be a color, such as green or blue, of light with a wavelength shorter than that of red light.

In this embodiment, the pixel unit 100A further includes the third sub-pixel 116. The third sub-pixel 116 may be adjacent to the first sub-pixel 112 and/or the second sub-pixel 114. In other words, the third sub-pixel 116 is adjacent to at least one of the first sub-pixel 112 or the second sub-pixel 114. The third sub-pixel 116 includes a third light-emitting element 116A. A light emitted by the third light-emitting element 116A has a third color C3. The third color C3 is different from the first color C1 and the second color C2. Accordingly, the first sub-pixel 112, the second sub-pixel 114, and the third sub-pixel 116 are respectively configured to present the first color C1, the second color C2, and the third color C3, realizing the colorful picture displayer by the display panel DP. In some embodiments, the first color C1, the second color C2, and the third color C3 are respectively red, green, and blue, but not limited thereto. For example, the first color C1, the second color C2, and the third color C3 may respectively be three different colors of light in the visible light.

The position of the peak wavelength in the luminescence spectrum determines the color of the emitted light. The peak wavelength may be defined as the wavelength with the maximum value of relative luminescence intensity in the luminescence spectrum. The luminescence spectrum may be a photoluminescence (PL) spectrum, an electroluminescence (EL) spectrum, or any spectrum formed by utilizing light emitted, absorbed, or scattered by matters. For example, the peak wavelength of red light approximately ranges from 620 nm to 750 nm, the peak wavelength of yellow light approximately ranges from 570 nm to 590 nm, the peak wavelength of green light approximately ranges from 495 nm to 570 nm, the peak wavelength of blue light approximately ranges from 450 nm to 495 nm, and the peak wavelength of violet light approximately ranges from 380 nm to 450 nm. Red light may be divided into deep-red light, hyper-red light, and far-red light. The peak wavelength of deep-red light approximately ranges from 620 nm to 660 nm, the peak wavelength of hyper-red light approximately ranges from 660 nm to 710 nm, and the peak wavelength of far-red light approximately ranges from 710 nm to 760 nm. In the embodiment herein, lights emitted at emission peak wavelengths with a difference of more than 50 nm may be defined as lights of different colors, and lights emitted at emission peak wavelengths with a difference of less than 5 nm may be defined as light of the same color. Alternately, the description of "the same color" in the disclosure may be understood based on the CIE 1931 xy chromaticity diagram created by the International Commission on Illumination (CIE). In some instances, two points on the CIE 1931 xy chromaticity diagram are considered as the same color when the differences between the coordinates of the two points in X-axis and Y-axis are both smaller than 0.02, but the disclosure is not limited thereto.

In this embodiment, a difference of an emission peak wavelength between the first light-emitting element 112A and the first light source element 112B is more than 50 nm. A difference of the emission peak wavelength between the light emitted by the first light source element 112B then converted through the first color conversion structure 112C and the light emitted by the first light-emitting element 112A falls within the range of 2 nm to 5 nm. Therefore, in addition to helping to improve the luminance of the first color C1 of the first sub-pixel 112, and thereby improving the luminous efficiency of the first sub-pixel 112, the first color conversion structure 112C converting the light emitted by the first light source element 112B further expands the color gamut of the first sub-pixel 112 by utilizing light color conversion.

In this embodiment, a difference between the peak wavelengths of the lights emitted by any two of the first light-emitting element 112A of the first sub-pixel 112, the second light-emitting element 114A of the second sub-pixel 114, and the third light-emitting element 116A of the third sub-pixel 116 is more than 50 nm. Accordingly, the first sub-pixel 112, the second sub-pixel 114, and the third sub-pixel 116 may respectively be configured to present three different colors of light, for example but not limited to, red light, green light, and blue light, to realize the colorful picture of the display panel DP.

In this embodiment, the first light-emitting element 112A, the first light source element 112B, the second light-emitting element 114A, and the third light-emitting element 116A are respectively light-emitting diodes. With continued reference to FIG. 2A and FIG. 2B, the first light-emitting element 112A has a top surface 112F, and the first light source element 112B has a top surface 112G. In some embodiments, a ratio of an area to a perimeter of each of the top surface 112F of the first light-emitting element 112A and the top surface 112G of the first light source element 112B is less than 10 or further less than 5. Similarly, the above-mentioned ratio for each of top surfaces of the second light-emitting element 114A and the third light-emitting element 116A is also less than 10 or further less than 5. In other words, each of the first light-emitting element 112A, the first light source element 112B, the second light-emitting element 114A, and the third light-emitting element 116A has a relatively small ratio of the area to the perimeter, that is, each may be implemented by adopting a small-sized light-emitting diode (e.g., a mini LED or a micro LED). Accordingly, the area of the pixel unit 100A of the display panel DP can be reduced, which helps to dispose a larger number of pixel units 100A in the same area to achieve a layout design with higher resolution. In general, when the size of a light-emitting diode is reduced, the leakage current and nonradiative recombination therein increase synchronously, which is mainly caused by the sidewall defect of the light-emitting element. Therefore, reduction in the size of a light-emitting diode may affect the external quantum efficiency thereof. In particular, because of the difference in material, this issue is more obvious in a red light-emitting diode.

In this embodiment, the first color C1 presented by the first sub-pixel 112 is red, for example. In addition, the first sub-pixel 112 presents the required display light by not only the first light-emitting element 112A but also the combination of the first light source element 112B and the first color conversion structure 112C. Accordingly, the configuration of the first light source element 112B and the first color conversion structure 112C is helpful to compensate the external quantum efficiency of the red light-emitting diode that may be adversely affected in the first light-emitting element 112A. Moreover, the insufficient luminance of the first light-emitting element 112A may be compensated by the light provided by the first light source element 112B and the first color conversion structure 112C without increasing the current density of the first light-emitting element 112A.

In this embodiment, as shown in FIG. 2B, the display panel DP may specifically include a first substrate SB1, a second substrate SB2, the first sub-pixel 112, the second sub-pixel 114, and the third sub-pixel 116. The first substrate SB1 and the second substrate SB2 are disposed opposite to each other. The first light-emitting element 112A and the first light source element 112B of the first sub-pixel 112, the second light-emitting element 114A of the second sub-pixel 114, and the third light-emitting element 116A of the third sub-pixel 116 are each disposed on the first substrate SB1. The first color conversion structure 112C is disposed between the first light source element 112B and the second substrate SB2, and is located in the light emission direction of the first light source element 112B. In addition, the display panel DP further includes a black matrix BM located between adjacent two of the first sub-pixel 112, the second sub-pixel 114, and the third sub-pixel 116. The black matrix BM may be disposed on the second substrate SB2. The black matrix BM disposed between adjacent two of the first sub-pixel 112, the second sub-pixel 114, and the third sub-pixel 116 prevents adjacent two of the first sub-pixel 112, the second sub-pixel 114, and the third sub-pixel 116 from being mixed with each other, which helps to improve the display contrast and display color of the display panel DP. In some embodiments, the black matrix BM may surround respective sub-pixel regions and the first sub-pixel 112, the second sub-pixel 114, and the third sub-pixel 116 are respectively disposed in the corresponding sub-pixel regions.

In this embodiment, the display panel DP may further include a color filter pattern 112D and a partition wall structure 112E in the first sub-pixel 112. The color filter pattern 112D is disposed on the first color conversion structure 112C and may be a filter pattern having the first color C1. The partition wall structure 112E may be disposed between the first substrate SB1 and the second substrate SB2 and surround the first color conversion structure 112C. The area of the projection of the color filter pattern 112D on the first substrate SB1 may be overlapped with the area of the projection of the first color conversion structure 112C on the first substrate SB1. Therefore, the color filter pattern 112D may be configured to filter the light emitted by the first color conversion structure 112C and/or the light emitted by the first light source element 112B to provide light having the first color C1. In some embodiments, when the light emitted by the first light source element 112B is not completely converted by the first color conversion structure 112C, the color filter pattern 112D may filter the unconverted light, and allow only the light with the wavelength of the first color C1 to be transmitted through the substrate SB2. Therefore, the configuration of the color filter pattern 112D helps to ensure that the color provided by the first sub-pixel 112 is the first color C1.

In some embodiments, the color filter pattern 112D may be optionally disposed on both of the first light-emitting element 112A and the first color conversion structure 112C. In other words, the area of the projection of the color filter pattern 112D on the first substrate SB1 may be overlapped with the areas of the projections of the first light-emitting element 112A, the first color conversion structure 112C, and the first light source element 112B on the first substrate SB1 as well. Since the light emitted by the first light-emitting element 112A has the first color C1, the light can penetrate the color filter pattern 112D, thereby improving the color purity of the light of the first sub-pixel 112. In addition, in some embodiments, the display panel DP may optionally further include a color filter pattern corresponding to at least one of the second sub-pixel 114 and the third sub-pixel 116. A color filter pattern corresponding to the second sub-pixel 114 may have the second color C2, and a color filter pattern corresponding to the third sub-pixel 116 may have the third color C3. In other words, a color filter pattern may be appropriately provided to each sub-pixel or omitted depending on requirements.

Figure 3A:
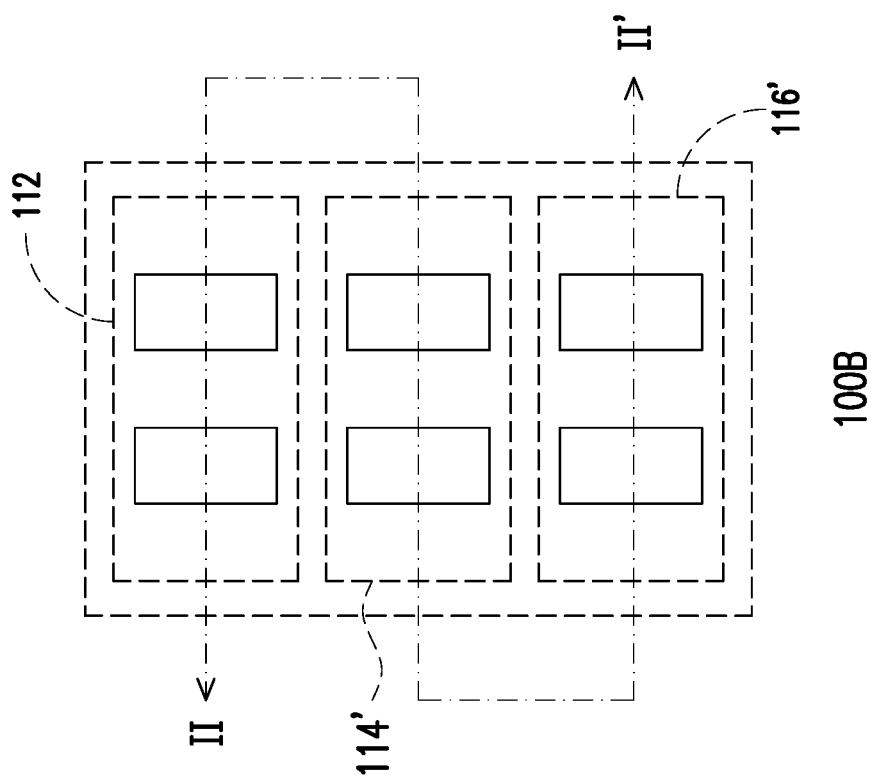
FIG. 3A is a schematic diagram of a pixel unit according to an embodiment of the disclosure.
Figure 3B:
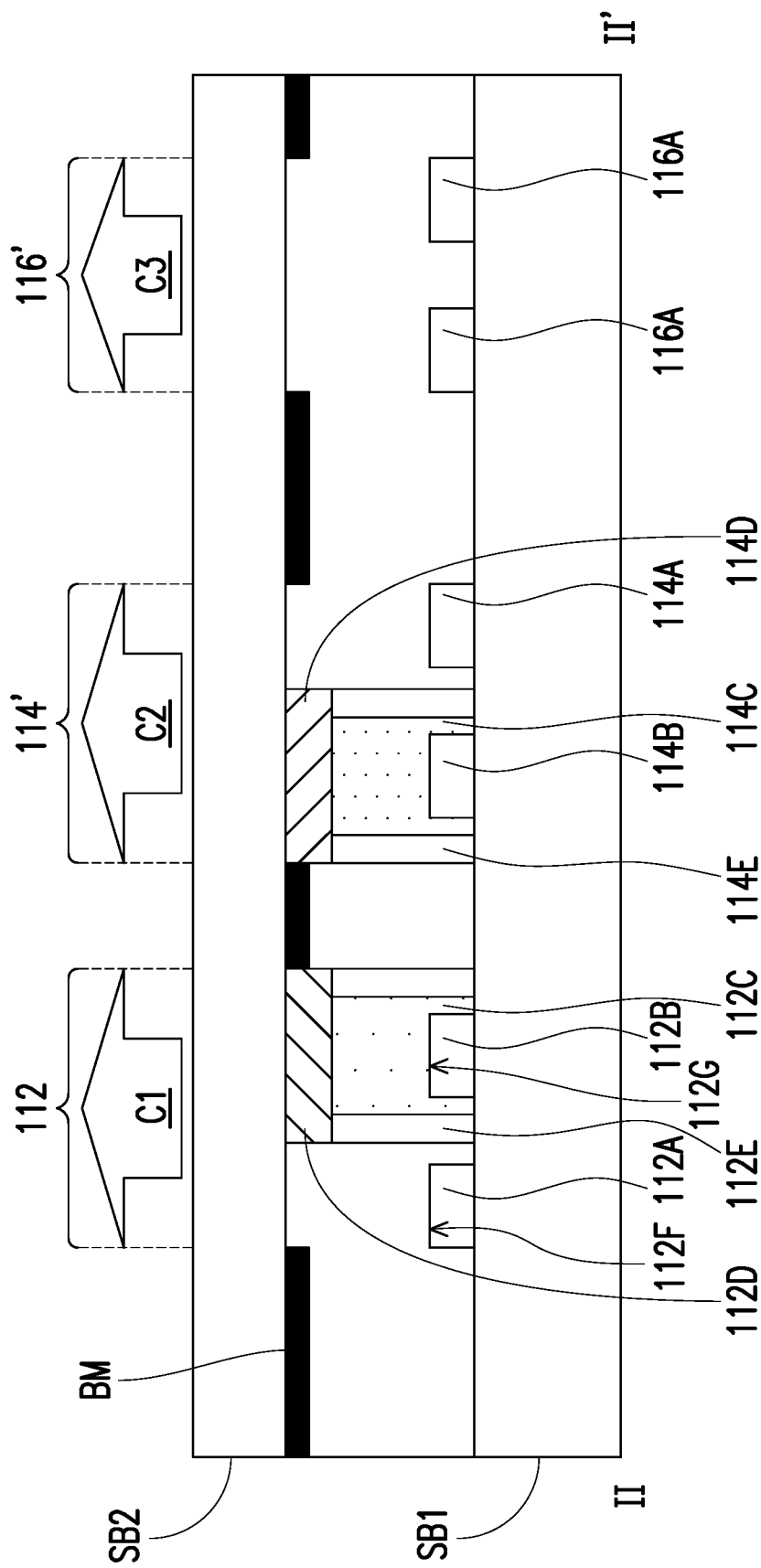
FIG. 3B is a schematic cross-sectional view of FIG. 3A along section line II-II'.

FIG. 3A is a schematic diagram of a pixel unit according to an embodiment of the disclosure. FIG. 3B is a schematic cross-sectional view of FIG. 3A along section line II-II'. In FIG. 3A and FIG. 3B, a pixel unit 100B is similar to the pixel unit 100A. Therefore, the same and similar members in the two embodiments will be labeled with the same and similar reference numerals, and the specific structures and designs of these members may be understood with reference to the description of the above embodiments. In this embodiment, the pixel unit 100B includes the first sub-pixel 112, a second sub-pixel 114', and a third sub-pixel 116'. The first sub-pixel 112 is the same as the first sub-pixel 112 of the above embodiments. Nonetheless, the second sub-pixel 114' includes the second light-emitting element 114A, a second light source element 114B, and a second color conversion structure 114C, and the third sub-pixel 116' includes two third light-emitting elements 116A. For each of the first light-emitting element 112A, the first light source element 112B, the second light-emitting element 114A, the second light source element 114B, and the two third light-emitting elements 116A, a light-emitting diode, such as a mini LED or a micro LED may be adopted.

The first sub-pixel 112 is configured to present the display light of the first color C1, the second sub-pixel 114' is configured to present the display light of the second color C2, and the third sub-pixel 116' is configured to present the display light of the third color C3, thereby achieving a colorful display result. In this embodiment, the design of the second sub-pixel 114' is similar to that of the first sub-pixel 112, for example, adopting two light-emitting means to present the display light of the second color C2. For example, the second light-emitting element 114A of the second sub-pixel 114' may directly emit light having the second color C2, and the second color conversion structure 114C is disposed on the second light source element 114B to convert a light emitted by the second light source element 114B into a light of the second color C2.

In the second sub-pixel 114', a difference of an emission peak wavelength between the light emitted by the second light-emitting element 114A and the light emitted by the second light source element 114B then converted through the second color conversion structure 114C is less than 5 nm. Therefore, the light emitted by the second light source element 114B and converted through the second color conversion structure 114C and the light emitted by the second light-emitting element 114A have the same color, helping to improve the luminance of the second color C2 of the second sub-pixel 114'. Herein, the description of "the same color" in the disclosure may be understood based on the CIE 1931 xy chromaticity diagram created by the International Commission on Illumination (CIE). In some instances, two points on the CIE 1931 xy chromaticity diagram are considered as the same color when the differences between the coordinates of the two points in X-axis and Y-axis are both smaller than 0.02, but the disclosure is not limited thereto.

In some embodiments, the first light source element 112B and the second light source element 114B may emit light of the same color. For example, the lights emitted by the first light source element 112B and the second light source element 114B may both be blue, but the disclosure is not limited thereto. In some embodiments, the lights emitted by the first light source element 112B and the second light source element 114B are not required to have the same color as long as the emitted lights are adapted to excite the corresponding color conversion structures.

In addition, the second sub-pixel 114' may further include a color filter pattern 114D and a partition wall structure 114E. The color filter pattern 114D is disposed on the second color conversion structure 114C and may be a filter pattern having the second color C2. The partition wall structure 114E may be disposed between the first substrate SB1 and the second substrate SB2 and surround the second color conversion structure 114C. The area of the projection of the color filter pattern 114D on the first substrate SB1 may be overlapped with the area of the projection of the second color conversion structure 114C on the first substrate SB1. The color filter pattern 114D may be configured to filter a light emitted by the second color conversion structure 114C and/or the light emitted by the second light source element 114B to provide light having the second color C2. In some embodiments, when the light emitted by the second light source element 114B is not completely converted by the second color conversion structure 114C, the color filter pattern 114D may filter part of the unconverted light, ensuring that the color provided by the second sub-pixel 114' is the second color C2. In some embodiments, the color filter pattern 114D may be disposed on both of the second light-emitting element 114A and the second color conversion structure 114C. For example, the area of the projection of the color filter pattern 114D on the first substrate SB1 may be overlapped with the areas of the projections of the second light-emitting element 114A and the second color conversion structure 114C on the first substrate SB1 as well. Accordingly, it helps to further improve the color purity of the second sub-pixel 114'.

The third sub-pixel 116' has two third light-emitting elements 116A, and the two third light-emitting elements 116A may emit light of the same color or different colors, such as the third color C3 or other colors. In some embodiments, the light of the third color C3 has a shorter wavelength than the light of the first color C1 and the light of the second color C2. For example, the third color C3 may be blue, while the first color C1 and the second color C2 may respectively be red and green. In some embodiments, the first light source element 112B of the first sub-pixel 112, the second light source element 114B of the second sub-pixel 114', and the third light-emitting elements 116A may emit light of the same color, but the disclosure is not limited thereto.

In the pixel unit 100B of this embodiment, the light source elements are adopted in both of the first sub-pixel 112 and the second sub-pixel 114' to aid the light-emitting elements, and the light source elements present light of the same color. In other words, by utilizing the color conversion structure, the light source element may aid the light-emitting element of the corresponding sub-pixel to present the required luminance or increase the wavelength band of the display color. Thereby, in the pixel unit 100B, the driving condition (for example but not limited to current density) of each light-emitting element is relatively simplified, and the complexity of the color of the light-emitting element may also be reduced or adjusted by the color conversion structure. Furthermore, as described above, the design where each of the three sub-pixels of the pixel unit 100B has two light-emitting diodes helps to make the structural layout of the pixel unit 100B relatively regular.

In this embodiment, the second light source element 114B is a light-emitting diode. In addition, similar to the description above, a ratio of an area to a perimeter of a top surface of the second light source element 114B may be less than 10 or further less than 5. Accordingly, the area of the pixel unit 100B of the display panel DP can be reduced, which helps to dispose a larger number of pixel units 100B in the same area to achieve a layout design with higher resolution.

Figure 4A:
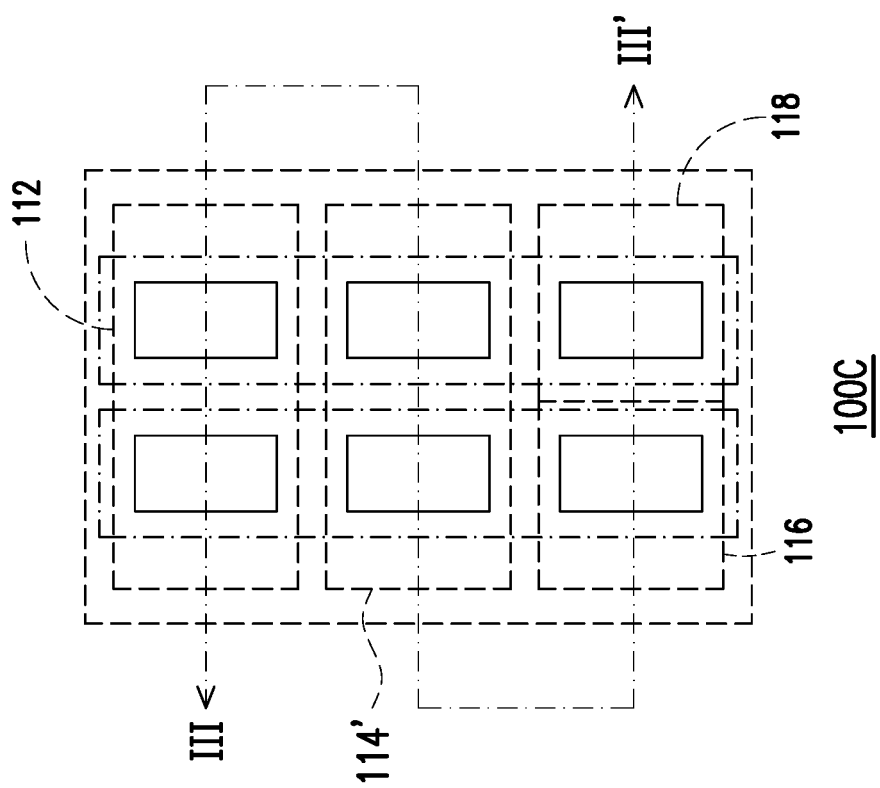
FIG. 4A is a schematic diagram of a pixel unit according to an embodiment of the disclosure.
Figure 4B:
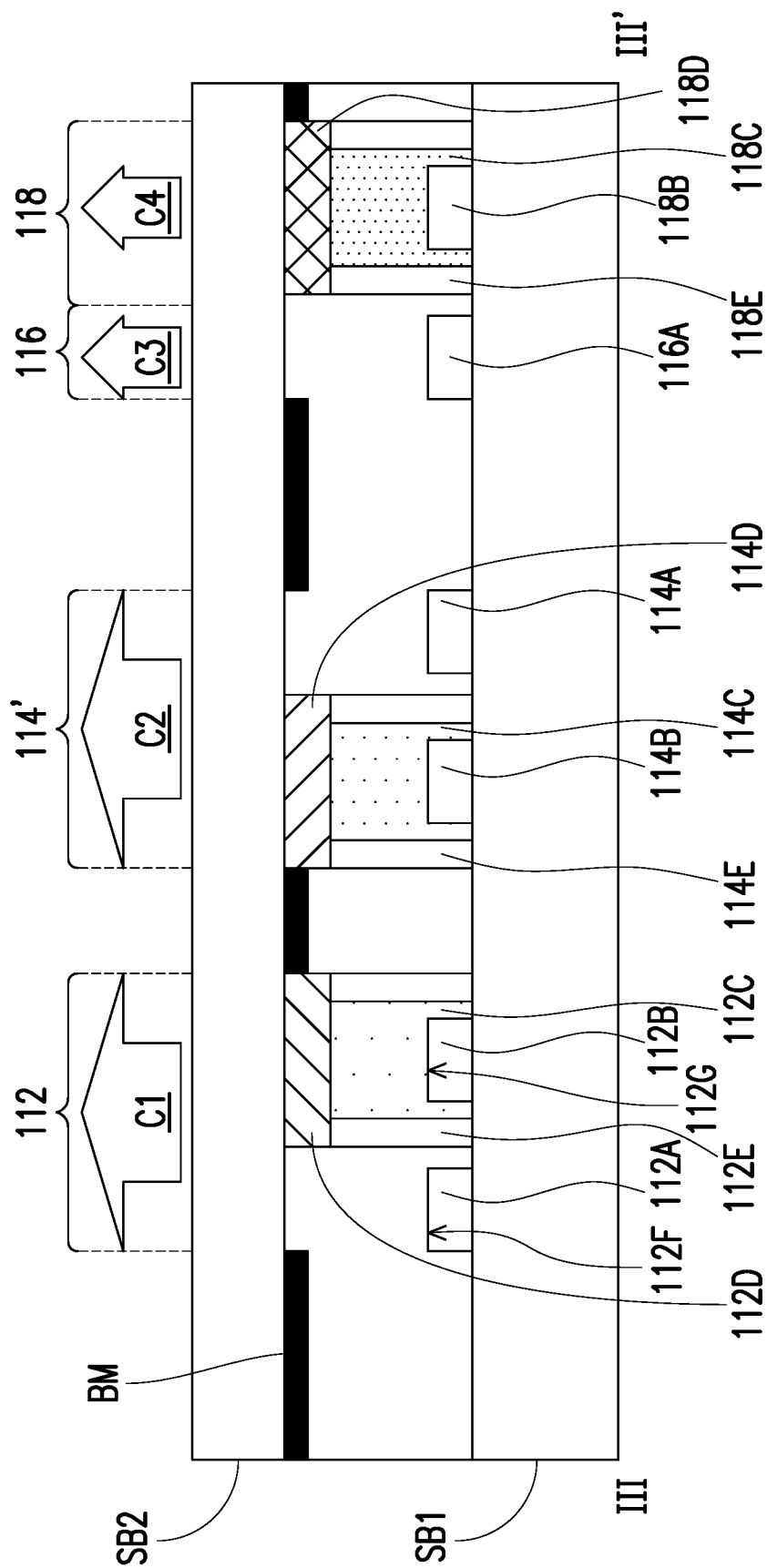
FIG. 4B is a schematic cross-sectional view of FIG. 4A along section line III-III'.

FIG. 4A is a schematic diagram of a pixel unit according to an embodiment of the disclosure. FIG. 4B is a schematic cross-sectional view of FIG. 4A along section line III-III'. In FIG. 4A and FIG. 4B, a pixel unit 100C is similar to the pixel unit 100B. Therefore, the same and similar members in the two embodiments will be labeled with the same and similar reference numerals, and the specific structures and designs of these members may be understood with reference to the description of the above embodiments. In this embodiment, the pixel unit 100C includes the first sub-pixel 112, the second sub-pixel 114', a third sub-pixel 116, and a fourth sub-pixel 118. The first sub-pixel 112 is the same as the first sub-pixel 112 of the above embodiments, the second sub-pixel 114' is the same as the second sub-pixel 114' of the above embodiments, and the third sub-pixel 116 is the same as the third sub-pixel 116 of the above embodiments. Specifically, the first sub-pixel 112 includes a first light-emitting element 112A, a first light source element 112B, a first color conversion structure 112C, a color filter pattern 112D and a partition wall structure 112E. The second sub-pixel 114' includes a second light-emitting element 114A, a second light source element 114B, a second color conversion structure 114C, a color filter pattern 114D and a partition wall structure 114E. The third sub-pixel 116 includes the third light emitting element 116A. The fourth sub-pixel 118 includes a fourth light source element 118B and a fourth color conversion structure 118C.

In the embodiment, the first sub-pixel 112 is configured to present the display light of the first color C1, the second sub-pixel 114' is configured to present the display light of the second color C2, the third sub-pixel 116 is configured to present the display light of the third color C3, and the fourth sub-pixel 118 is configured to present the display light of a fourth color C4, thereby achieving a colorful display result. The mechanisms how the first sub-pixel 112, the second sub-pixel 114' and the third sub-pixel 116 present the corresponding colors and the structures of the first sub-pixel 112, the second sub-pixel 114' and the third sub-pixel 116 may refer to the previous embodiments and will not repeat here. The fourth color C4 may be achieved by the fourth color conversion structure 118C converting the light emitted from the fourth light source element 118B to present the desired color. In some embodiments, the first color C1, the second color C2, and the third color C3 may respectively be red, green, and blue, while the fourth color C4 may be yellow. The fourth light source element 118B and the fourth color conversion structure 118C of the fourth sub-pixel 118 may be integrated with the third sub-pixel 116 in the same sub-pixel region, so that the light of the third color C3 and the light of the fourth color C4 are emitted from one single sub-pixel region. In some embodiments, the third color C3 presented by the third sub-pixel 116 and the fourth color C4 presented by the fourth color C4 may be mixed to present white color, such that the corresponding sub-pixel region would present the display light of substantially white, but the disclosure is not limited thereto.

In this embodiment, the third light-emitting element 116A and the fourth light source element 118B may be the same type elements, such as light-emitting diodes of the same color, but the disclosure is not limited thereto. In alternative embodiments, the third light-emitting element 116A and the fourth light source element 118B may be light-emitting diodes emitting light of different colors. In the embodiment, the fourth light source element 118B is a light emitting diode and a ratio of an area to a perimeter of a top surface of the fourth light source element 118B may be less than 10 or further less than 5. However, the disclosure is not limited thereto. In addition, the light emitted by the fourth light source element 118B then converted through the fourth color conversion structure 118C and the light emitted by the third light-emitting element 116A may have different colors, respectively being yellow and blue, for example. Accordingly, the third sub-pixel 116 and the fourth sub-pixel 118 in the same sub-pixel region have the display light of the third color C3 and the display light of the fourth color C4 that are different.

In addition, the fourth sub-pixel 118 may further include a color filter pattern 118D and a partition wall structure 118E. The color filter pattern 118D is disposed on the third color conversion structure 118C and may be a filter pattern having the fourth color C4. The partition wall structure 118E may be disposed between the first substrate SB1 and the second substrate SB2 and surround the fourth color conversion structure 118C. The area of the projection of the color filter pattern 118D on the first substrate SB1 may be overlapped with the area of the projection of the fourth color conversion structure 118C on the first substrate SB1. The color filter pattern 118D may be configured to filter a light emitted by the fourth color conversion structure 118C and/or the light emitted by the fourth light source element 118B to provide light having the fourth color C4. In some embodiments, when the light emitted by the fourth light source element 118B is not completely converted by the fourth color conversion structure 118C, the color filter pattern 118D may filter the unconverted light, and allow only the light with the wavelength of the fourth color C4 to be transmitted through the substrate SB2.

In summary of the foregoing, in the display panel according to the embodiments of the disclosure, at least one of the sub-pixels in the pixel unit includes the light-emitting element, the light source element, and the color conversion structure. The color conversion structure is disposed on the light source element and converts the light emitted by the light source element into a light of the same color as that of the light-emitting element, thereby improving the luminous efficiency of the sub-pixel. In addition, in some of the sub-pixels, the color conversion structure is disposed on the light source element and converts the light emitted by the light source element into a light of different colors from that of the light-emitting element, so that the sub-pixels provide different colors, improving the color rendering of the display panel.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A display panel comprising:
a pixel unit comprising:
a first sub-pixel comprising:
a first light-emitting element, wherein a light emitted by the first light-emitting element has a first color;
a first light source element; and
a first color conversion structure disposed on the first light source element and adapted to convert a light emitted by the first light source element into a light of the first color; and
a second sub-pixel, comprising a second light-emitting element, wherein a light emitted by the second light-emitting element has a second color different from the first color,
wherein the second sub-pixel further comprises a second light source element and a second color conversion structure, and the second color conversion structure is disposed on the second light source element and is adapted to convert a light emitted by the second light source element into a light of the second color.
2. The display panel according to claim 1, wherein a difference between an emission peak wavelength of the first light-emitting element and an emission peak wavelength of the first color conversion structure is less than 5 nm.
3. The display panel according to claim 1, wherein a difference between an emission peak wavelength of the first light-emitting element and an emission peak wavelength of the second light-emitting element is greater than 50 nm.

4. The display panel according to claim 1, wherein the pixel unit further comprises a third sub-pixel adjacent to at least one of the first sub-pixel and the second sub-pixel, the third sub-pixel comprises a third light-emitting element, and a light emitted by the third light-emitting element has a third color, the third color being different from the first color and the second color.

5. The display panel according to claim 4, further comprises a fourth sub-pixel adapted to emit a light of a fourth color, the fourth color being different from the first color, the second color, and the third color.

6. The display panel according to claim 5, wherein the fourth sub-pixel comprises a fourth light source element and a fourth color conversion structure, the fourth color conversion structure is disposed on the fourth light source element, and a light emitted by the fourth light source element is converted by the fourth color conversion structure to the fourth color.

7. The display panel according to claim 1, wherein the first light-emitting element, the first light source element, and the second light-emitting element each have a top surface, and a ratio of an area to a perimeter of each of the top surfaces is less than 10.

8. The display panel according to claim 1, wherein the first color is red, and the second color is green or blue.

9. The display panel according to claim 1, further comprising a color filter pattern located on at least one of the first sub-pixel and the second sub-pixel.

10. The display panel according to claim 1, further comprising a black matrix located between the first sub-pixel and the second sub-pixel.

11. The display panel according to claim 1, wherein the light emitted by the first light source element is blue light, ultraviolet light, or deep ultraviolet light.

* * * * *